United States Patent
Lee et al.

(10) Patent No.: US 11,837,438 B2
(45) Date of Patent: Dec. 5, 2023

(54) SUBSTRATE TREATING APPARATUS

(71) Applicant: Semes Co., Ltd., Cheonan-si (KR)

(72) Inventors: Jung Hwan Lee, Ansan-si (KR); Seung Pyo Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 155 days.

(21) Appl. No.: 17/519,461

(22) Filed: Nov. 4, 2021

(65) Prior Publication Data

US 2022/0148853 A1 May 12, 2022

(30) Foreign Application Priority Data

Nov. 6, 2020 (KR) .......................... 10-2020-0147787

(51) Int. Cl.
 *H01J 37/32* (2006.01)
(52) U.S. Cl.
 CPC .. *H01J 37/32082* (2013.01); *H01J 37/32724* (2013.01); *H01J 37/32935* (2013.01); *H01J 2237/334* (2013.01)
(58) Field of Classification Search
 CPC . H05H 1/46; H05H 2242/26; H01J 37/32091; H01J 37/32174; H01J 37/32522; H01J 37/32706; H01J 37/32724; H01J 37/32715; H01J 37/32697; H01J 37/32192; H01J 37/32082; H01J 2237/334; H03H 1/0007; H03H 7/38; H03H 7/01; H01L 21/6831; H01L 21/67103; H01L 21/67069; H01L 21/3065; H01L 21/02252; C23C 16/5096; C23C 16/50
 See application file for complete search history.

(56) References Cited

U.S. PATENT DOCUMENTS

| | | | |
|---|---|---|---|
| 2014/0110061 A1* | 4/2014 | Okunishi | H01L 21/67103 156/345.52 |
| 2019/0109576 A1* | 4/2019 | Long | G01S 13/00 |
| 2020/0234924 A1 | 7/2020 | Yokogawa et al. | |

FOREIGN PATENT DOCUMENTS

| | | |
|---|---|---|
| CN | 107210217 A | 9/2017 |
| JP | S60-105297 A | 6/1985 |
| JP | H07-25618 U | 5/1995 |
| JP | 2008-034812 A | 2/2008 |
| JP | 2008229337 A | 10/2008 |
| JP | 2013-543252 A | 11/2013 |
| JP | 2014-3179 A | 1/2014 |
| JP | 2014-99585 A | 5/2014 |
| KR | 1020140050560 A | 4/2014 |

(Continued)

*Primary Examiner* — Renan Luque
(74) *Attorney, Agent, or Firm* — Procopio, Cory, Hargreaves & Savitch LLP

(57) ABSTRACT

A substrate treating apparatus includes a chamber having a treatment space, a first power supply that is connected to a first component provided in the treatment space and transmits power having a first frequency to the first component, a second power supply that is provided in the treatment space, is connected to a second component different from the first component, and transmits power having a second frequency smaller than the first frequency to the second component, and a coupling blocking structure installed on a power line connected to the second power supply and the second component, wherein the coupling blocking structure is electrically connected to the power line and includes a conductive line having a coil shape.

17 Claims, 11 Drawing Sheets

(56) References Cited

FOREIGN PATENT DOCUMENTS

| KR | 1020200044686 A | 4/2020 |
|----|----|----|
| KR | 11020200053622 A | 5/2020 |
| TW | 201546869 A | 12/2015 |
| TW | 201830854 A | 8/2018 |

\* cited by examiner

SUBSTRATE TREATING APPARATUS

CROSS-REFERENCE TO RELATED APPLICATIONS

A claim for priority under 35 U.S.C. § 119 is made to Korean Patent Application No. 10-2020-0147787 filed on Nov. 6, 2020, in the Korean Intellectual Property Office, the entire contents of which are hereby incorporated by reference.

BACKGROUND

Embodiments of the inventive concept described herein relate to a substrate treating apparatus.

Plasma refers to an ionized gaseous state including ions, radicals, electrons, and the like. The plasma is generated by very high temperature, strong electric fields, or radio frequency (RF) electromagnetic fields. A semiconductor device manufacturing process may include an etching process of removing a thin film formed on a substrate, such as a wafer, using plasma. The etching process is performed as ions and/or radicals contained in the plasma collide with a thin film on the substrate or react with the thin film.

An apparatus for treating a substrate such as a wafer using plasma includes a process chamber having a treatment space, an RF power supply for generating the above-described electric fields or RF electromagnetic fields, and a heater for adjusting the temperature of the treated substrate. Further, the heater is connected, via a heater line, to a heater power supply that transmits power to the heater. In this way, in the apparatus for treating a substrate using plasma, since high-frequency power applied by the RF power supply flows into the heater power supply through the heater, the heater power supply may fail or malfunction. Further, FIG. 1 illustrates an etching rate "A" according to a distance from the center of the substrate when the heater line is removed from the heater and an etching rate "B" according to a distance from the center of the substrate when the heater and the heater line are connected to each other. As may be seen from FIG. 1, when the heater and the heater line are connected to each other, the etching rate for the substrate is lower. This is because the high-frequency power applied by the RF power supply flows to the heater power supply through the heater.

SUMMARY

Embodiments of the inventive concept provide a substrate treating apparatus that may efficiently treat a substrate.

Embodiments of the inventive concept also provide a substrate treating apparatus that may further improve an etching rate for the substrate.

Embodiments of the inventive concept also provide a substrate treating apparatus that may block coupling of high-frequency power applied by an RF power supply to a heater power supply.

Embodiments of the inventive concept also provide a substrate treating apparatus that blocks coupling of the high-frequency power applied by the RF power supply to the heater power supply and has a coupling blocking structure that is easily installed and/or replaced.

The aspect of the inventive concept is not limited thereto, and other unmentioned aspects of the inventive concept may be clearly appreciated by those skilled in the art from the following descriptions.

The inventive concept provides a substrate treating apparatus. According an embodiment, a substrate treating apparatus includes a chamber having a treatment space, a first power supply that is a high-frequency power supply and applies power to a first component provided in the treatment space, a second power supply that is an alternating current (AC) power supply or a direct current (DC) power supply and applies power to a second component provided in the treatment space, and a coupling blocking structure that is installed on a power line connected to the second power supply and the second component and blocks coupling of high-frequency power generated by the first power supply to the second power supply, wherein the coupling blocking structure is electrically connected to the power line and includes a conductive line having a coil shape.

According to an embodiment, the coupling blocking structure may further include a dielectric having a columnar shape around which the conductive line is wound.

According to an embodiment, a spiral groove in which the conductive line is provided may be formed in the dielectric.

According to an embodiment, the coupling blocking structure may further include a conductive part electrically connected to one end of the conductive line and one end of the power line.

According to an embodiment, a pin groove, into which a conductive pin connected to the one end of the power line is inserted, may be formed in the conductive part.

According to an embodiment, the coupling blocking structure may further include a dielectric having a columnar shape around which the conductive line is wound, a conductive part electrically connected to one end of the conductive line and one end of the power line, and an insulator that surrounds the conductive part, the dielectric, and the conductive line.

According to an embodiment, the second component may be a heater that heats the treatment space or a substrate treated in the treatment space.

The first component may be an electrode plate that generates plasma in the treatment space.

Further, the inventive concept provides a substrate treating apparatus. According to an embodiment, a substrate treating apparatus includes a chamber having a treatment space, a first power supply that generates a radio frequency (RF) electromagnetic field, a second power supply that transmits power to a heater provided in the treatment space, and a coupling blocking structure installed on a power line provided between the second power supply and the heater, wherein the coupling blocking structure is electrically connected to the power line and includes a conductive line having a coil shape.

According to an embodiment, the coupling blocking structure may further include a dielectric having a columnar shape around which the conductive line is wound.

According to an embodiment, a spiral groove in which the conductive line is provided may be formed in the dielectric.

According to an embodiment, the power line may include a first power line provided at a front end of the coupling blocking structure, and a second power line provided at a rear end of the coupling blocking structure, and the coupling blocking structure may include a first conductive part electrically connected to one end of the conductive line and one end of the first power line, and a second conductive part electrically connected to the other end of the conductive line and one end of the second power line.

According to an embodiment, a pin groove, into which a conductive pin connected to the power line is inserted, may be formed in at least one of the first conductive part and the second conductive part.

According to an embodiment, at least one of the first conductive part and the second conductive part may have a columnar shape.

According to an embodiment, the coupling blocking structure may further include a dielectric having a columnar shape around which the conductive line is wound, a conductive part electrically connected to one end of the conductive line and one end of the power line, and an insulator that surrounds the conductive part, the dielectric, and the conductive line.

According to an embodiment, the first power supply may be an RF power supply that applies power to an antenna or an electrode plate, and the second power supply may be an AC power supply or a DC power supply that transmits power to the heater.

Further, the inventive concept provides a substrate treating apparatus. According to an embodiment, a substrate treating apparatus includes a chamber having a treatment space, a support unit that supports a substrate in the treatment space, an RF power supply that generates an electric field in the treatment space, a heating power supply that transmits power to a heater provided in the support unit, and a coupling blocking structure installed on a power line provided between the heating power supply and the heater, wherein the coupling blocking structure may include a conductive line electrically connected to the power line and having a coil shape, and a dielectric having a columnar shape around which the conductive line is wound and having a spiral groove in which the conductive line is provided.

According to an embodiment, the coupling blocking structure may further include a conductive part electrically connected to one end of the conductive line and one end of the power line, and an insulator that surrounds the conductive part, the dielectric, and the conductive line.

According to an embodiment, any one of a first coupling blocking structure in which the conductive line is wound around the dielectric "n" times and a second coupling blocking structure in which the number of times the conductive line is wound around the dielectric is different from that of the first coupling blocking structure may be installed on the power line.

According to an embodiment, any one of a first coupling blocking structure in which the conductive line has a first thickness and a second coupling blocking structure in which the conductive line has a second thickness that is different from the first thickness may be installed on the power line.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
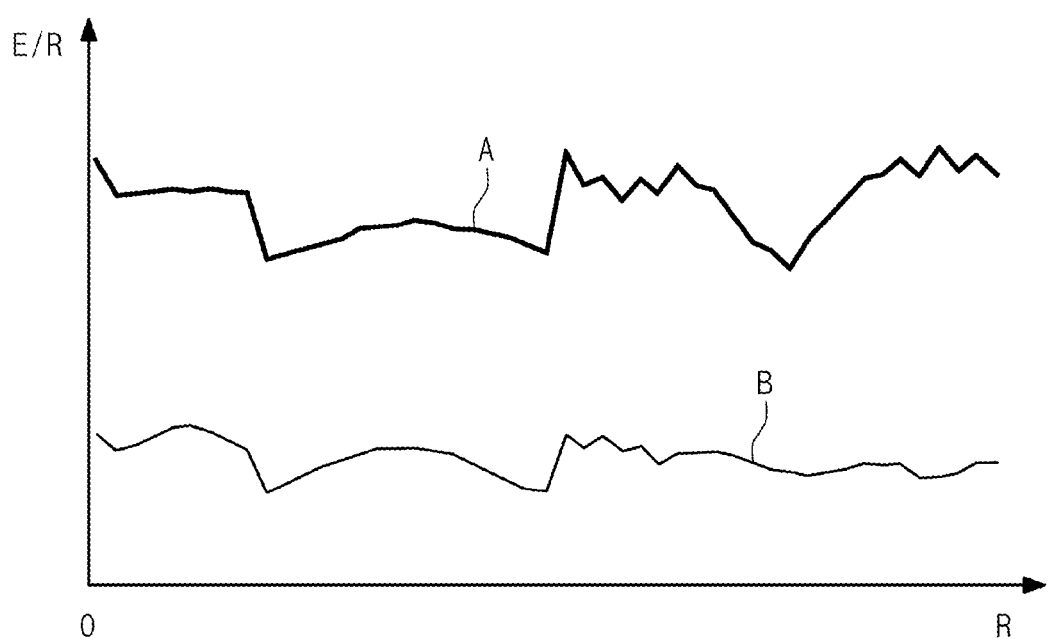
FIG. 1 is a view illustrating etching rates for a substrate when a heater line is connected to the heater and when the heater line is removed from the heater.

Hereinafter, exemplary embodiments of the inventive concept will be described in detail with reference to the accompanying drawings so that those skilled in the art to which the inventive concept pertains may easily carry out the inventive concept. However, the inventive concept may be implemented in various different forms, and is not limited to the embodiments. Further, in a description of the embodiments of the inventive concept, a detailed description of related known functions or configurations will be omitted when they make the essence of the inventive concept unnecessarily unclear. In addition, the same reference numerals are used for parts that perform similar functions and operations throughout the drawings.

The expression of 'including' some elements may mean that another element may be further included without being excluded unless there is a particularly contradictory description. In detail, the terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

Singular expressions include plural expressions unless clearly otherwise indicated in the context. Further, in the drawings, the shapes and sizes of the elements may be exaggerated for clearer description.

The terms such as first and second may be used to describe various elements, but the elements are not limited to the terms. The terms may be used only for the purpose of distinguishing one element from another element. For example, while not deviating from the scope of the inventive concept, a first element may be named a second element, and similarly, the second element may be named the first element.

When it is mentioned that one element is "connected to" or "electrically connected to" another element, it should be understood that the first element may be directly connected or electrically connected to the second element but a third element may be provided therebetween. On the other hand, when it is mentioned that an element is "directly connected to" or "directly electrically connected to" another element, it should be understood that a third element is not present between them. It should be construed that other expressions that describe the relationships between elements, such as "between", "directly between", "adjacent to", and "directly adjacent to" may have the same purpose.

In addition, unless defined otherwise, all terms used herein, including technical or scientific terms, have the same meanings as those generally understood by those skilled in the art to which the inventive concept pertains. The terms defined in the generally used dictionaries should be construed as having the meanings that coincide with the meanings of the contexts of the related technologies, and should not be construed as ideal or excessively formal meanings unless clearly defined in the specification of the inventive concept.

Hereinafter, embodiments of the inventive concept will be described with reference to FIGS. 2 to 11.

Figure 2:
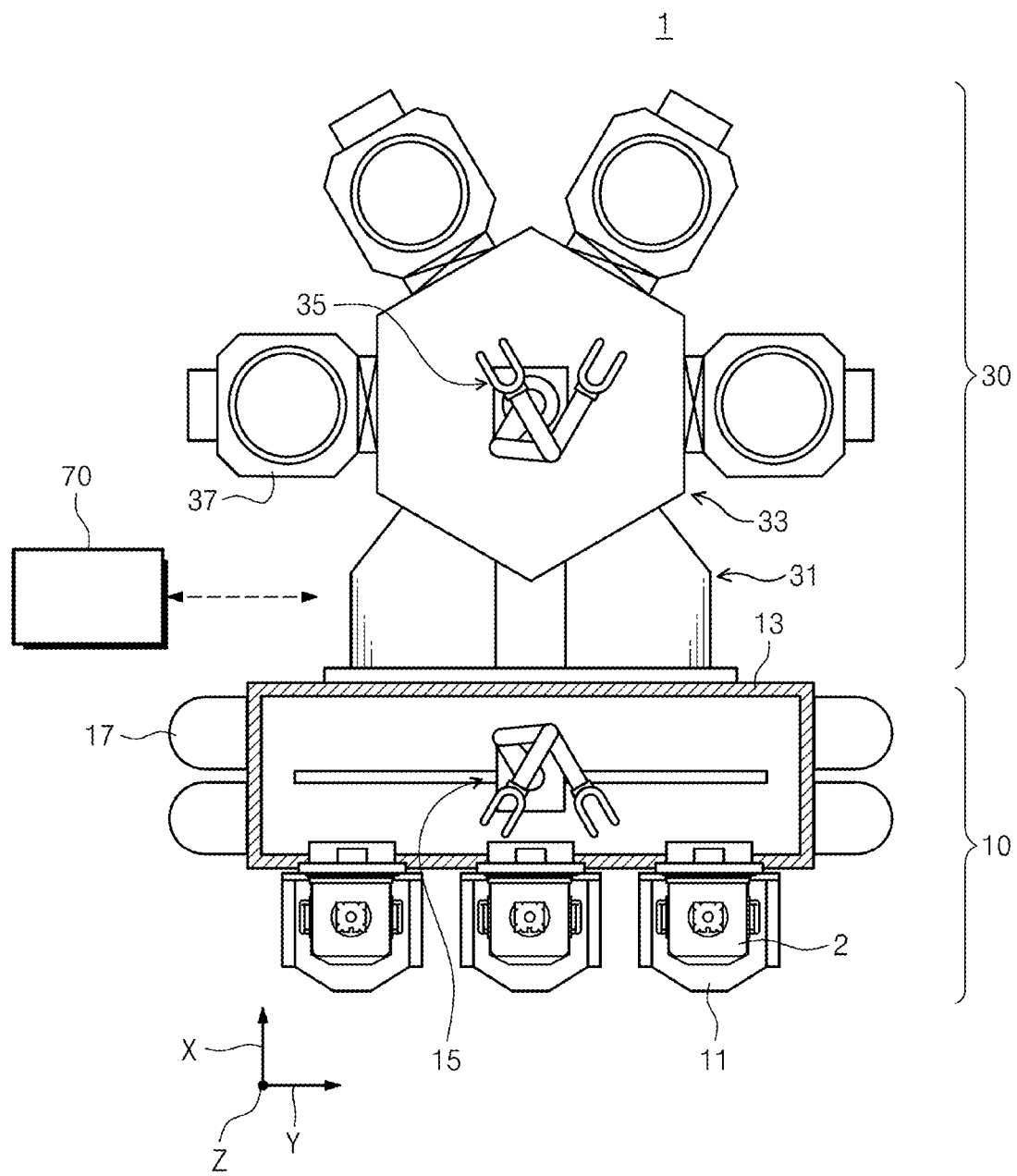
FIG. 2 is a view illustrating a substrate treating apparatus according to one embodiment of the inventive concept.

FIG. 2 is a plan view schematically illustrating a substrate treating apparatus according to an embodiment of the inventive concept. Referring to FIG. 2, a substrate treating apparatus 1 according to an embodiment of the inventive concept may include an index unit 10, a process executing unit 30, and a controller 70. The index unit 10 and the process executing unit 30 may be arranged along a first direction "X" when viewed from the top. Hereinafter, a direction that is perpendicular to the first direction "X" when viewed from the top is defined as a second direction "Y". Further, a direction that is perpendicular to the first direction "X" and the second direction "Y" is defined as a third direction "Z". Here, the third direction "Z" may refer to a direction that is perpendicular to a ground surface.

The index unit 10 may include a load pot 11, an index chamber 13, a first transfer robot 15, and a side buffer 17.

A container 2 may be seated on the load pot 11. Some containers 2 among the containers 2 seated on the load pot 11 may accommodate a substrate "W" (for example, a wafer) transferred to the process executing unit 30. The containers 2 may be transferred to the load pot 11 by a container transfer apparatus, may be loaded in the load pot 11 or unloaded from the load pot 11, and may be transferred. The container transfer apparatus may be an overhead transport apparatus (hereinafter, an OHT), but the inventive concept is not limited thereto, and the containers 2 may be transferred by various apparatuses that transfer the containers 2. Further, an operator may directly load the containers 2 in the load pot 11 or unload the containers 2 seated in the load pot 11 from the load pot 11.

The index chamber 13 may be provided between the load pot 11 and the process executing unit 30. The index chamber 13 may be maintained in an atmospheric atmosphere. The side buffer 17 that is a keeping site may be installed on one side of the index chamber 13. Further, an alignment unit that aligns the substrate "W" may be provided at a part of the side buffer 17.

Further, the first transfer robot 15 may be provided in the index chamber 13. The first transfer robot 15 may transfer the substrate "W" between the containers 2 seated in the load pot 11, a load lock chamber 31, which will be described below, and the side buffer 17.

The process executing unit 30 may include the load lock chamber 31, a transfer chamber 33, a second transfer robot 35, and a process chamber 37.

The load lock chamber 31 may be disposed between the transfer chamber 33 and the index chamber 13. The load lock chamber 31 provides a space in which the substrate "W" is temporarily stored. A vacuum pump and a valve that are not illustrated may be installed in the load lock chamber 31 such that an internal atmosphere of the load lock chamber 31 may be converted between an atmospheric atmosphere and a vacuum atmosphere. Since the internal atmosphere of the transfer chamber 33, which will be described below, is maintained in the vacuum atmosphere, the atmosphere of the load lock chamber 31 may be converted between the atmospheric atmosphere and the vacuum atmosphere to transfer the substrate "W" and the like between the transfer chamber 33 and the index chamber 13.

The transfer chamber 33 may be disposed between the load lock chamber 31 and the process chamber 37. As described above, the internal atmosphere of the transfer chamber 33 may be maintained in the vacuum atmosphere. Further, the second transfer robot 35 may be provided in the transfer chamber 33. The second transfer robot 35 may transfer the substrate "W" between the load lock chamber 31 and the process chamber 37. The second transfer robot 35 may transfer the substrate "W" between a treatment space of the process chamber 37 and the transfer chamber 33. The second transfer robot 35 includes a hand 352. The second transfer robot 35 may be configured to move the hand 352 in the first direction "X", the second direction "Y", and the third direction "Z". Further, the second transfer robot 35 may be configured to rotate the hand 352 about the third direction "Z".

At least one process chamber 37 may be connected to the transfer chamber 33. The process chamber 37 may be a chamber in which a process on the substrate "W" is performed. The process chamber 37 may be a liquid treating chamber in which the substrate "W" is treated by supplying a treatment liquid to the substrate "W". Further, the process chamber 37 may be a plasma chamber in which the substrate "W" is treated by using plasma. Further, some of the process chambers 37 may be liquid treating chambers in which the substrate "W" is treated by supplying a treatment liquid to the substrate "W", and the other process chambers 37 may be plasma chambers in which the substrate "W" is treated by using plasma. However, the inventive concept is not limited thereto, and a substrate treating process performed in the process chamber 37 may be variously modified to known substrate treating processes. Further, when the process chamber 37 is a plasma chamber in which the substrate "W" is treated by using the plasma, the plasma chamber may be a chamber in which an etching or ashing process of removing a thin film on the substrate "W" is performed by using the plasma. However, the inventive concept is not limited thereto, and a plasma treatment process performed in the process chamber 37 may be variously modified to known plasma treatment processes. A detailed structure of the process chamber 37 will be described below.

Further, FIG. 2 illustrates as an example that the transfer chamber 33 has a substantially hexagonal shape when viewed from the top, and four process chambers 37 connected to the transfer chamber 33 are provided, but the inventive concept is not limited thereto. For example, the shape of the transfer chamber 33 and the number of process chambers 37 may be variously modified according to the necessity of the user, and the number of substrates that requires a treatment.

The controller 70 may control the substrate treating apparatus 1. The controller 70 may control the index unit 10 and the process executing unit 30. The controller 70 may control the first transfer robot 15 and the second transfer robot 35. The controller 70 may control the substrate treating apparatus provided in the process chamber 37 such that the substrate "W" may be treated in the process chamber 37 by using the plasma. Further, the controller 70 may control a location of the hand 352 of the second transfer robot 35. For example, the controller 70 may control the second transfer robot 35 so that the hand 352 may move in the first direction "X", the second direction "Y", and the third direction "Z". Further, the controller 70 may control the second transfer robot 35 so that the hand 352 rotates about the third direction "Z". Further, the controller 70 may control the second transfer robot 35 to drive components installed in the hand 352.

Further, the controller 70 may include a process controller including a microprocessor (computer) that executes control of the substrate treating apparatus 1, a user interface including a keyboard for inputting commands to allow an operator to manage the substrate treating apparatus 1 and a display that visualizes and displays an operation situation of the substrate treating apparatus 1, and a memory unit for storing a processing recipe including a control program for executing processing executed by the substrate treating apparatus 1 under a control of the process controller or a program for executing processing in components according to various data and processing conditions. Further, the user interface and the memory unit may be connected to the process controller. The processing recipe may be stored in a memory medium of the memory unit, and the memory medium may be a hard disk, and may be a transportable disk such as a CD-ROM and a DVD and a semiconductor memory such as a flash memory.

Figure 3:
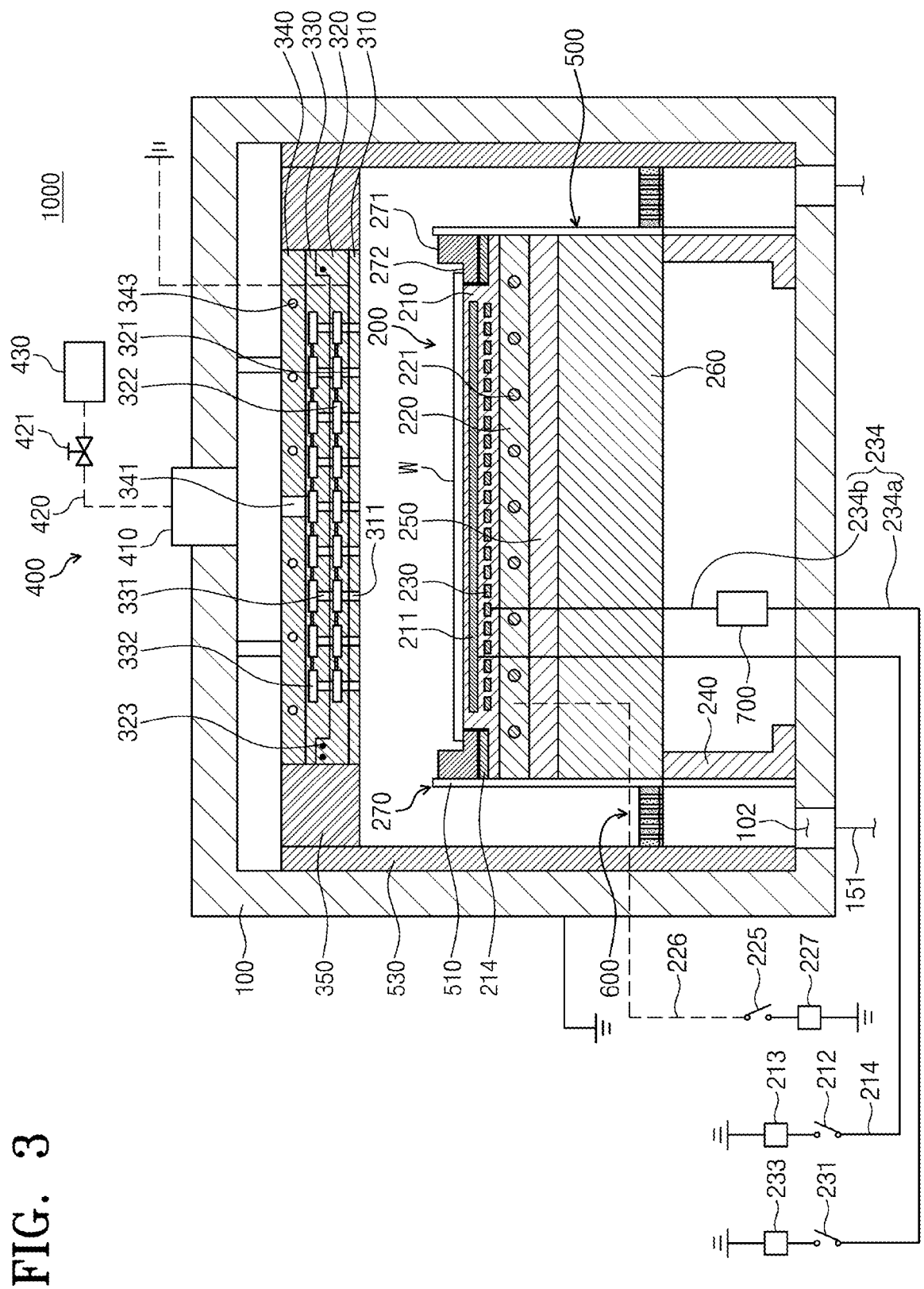
FIG. 3 is a view illustrating the substrate treating apparatus provided in a process chamber of FIG. 2.

FIG. 3 is a view illustrating the substrate treating apparatus provided in a process chamber of FIG. 2. Referring to FIG. 3, a substrate treating apparatus 1000 provided in the process chamber 37 may include a chamber 100, a support unit 200, a shower head unit 300, a gas supply unit 400, a plasma source, a liner unit 500, a baffle unit 600, and a coupling blocking structure 700.

The chamber 100 may have a treatment space. The chamber 100 may provide the treatment space in which a treatment process on the substrate "W" is performed. The chamber 100 may be provided in a sealed shape. The chamber 100 may be made of a metal material. As an example, the chamber 100 may be made of an aluminum material. The chamber 100 may be grounded. An exhaust hole 102 may be formed in a bottom surface of the chamber 100. The exhaust hole 102 may be connected to an exhaust line 151. The exhaust line 151 is connected to a pump (not illustrated). Reaction by-products generated during the process and gas remaining in an internal space of the chamber 100 may be discharged to the outside through the exhaust line 151. The inside of the chamber 100 may be decompressed to a predetermined pressure by the exhaust process.

A heater (not illustrated) may be provided on a wall of the chamber 100. The heater heats the wall of the chamber 100. The heater may be electrically connected to a heating power supply (not illustrated). The heater may generate heat by resisting a current applied from the heating power supply. The heat generated by the heater may be transmitted to the internal space. The treatment space may be maintained at a predetermined temperature due to the heat generated by the heater. The heater may be provided as a coil-shaped heating wire. One or more heaters may be provided on the wall of the chamber 100.

The support unit 200 may support the substrate "W" in the treatment space. The support unit 200 may suction and support the substrate "W" using an electrostatic force. Unlike this, the support unit 200 may support the substrate "W" in various manners such as mechanism clamping. Hereinafter, an example in which the support unit 200 is an electrostatic chuck will be described.

The support unit 200 may include a support plate 210, an electrode plate 220, a heating member 230, a lower plate 240, a plate 250, a lower board 260, and a ring member 270.

The substrate "W" is placed on the support plate 210. The support plate 210 is provided in a disk shape. The support plate 210 may be made of a dielectric material.

An upper surface of the support plate 210 may have a smaller radius than that of the substrate "W". When the substrate "W" is placed on the support plate 210, an edge region of the substrate "W" may be located outside the support plate 210. Further, the edge region of the support plate 210 may be stepped. An insulator 214 may be disposed in the stepped edge region of the support plate 210. The insulator 214 may have a ring shape when viewed from the top.

The support plate 210 receives external power to apply an electrostatic force to the substrate "W". The support plate 210 is provided with an electrostatic electrode 211. The electrostatic electrode 211 may be provided in a monopolar type or a bipolar type. The electrostatic electrode 211 may be electrically connected to a suction power supply 213 via a suction power line 214. The suction power supply 213 may include a direct current (DC) power supply. A switch 212 may be installed between the electrostatic electrode 211 and the suction power supply 213. The electrostatic electrode 211 may be electrically connected to the suction power supply 213 according to an ON/OFF state of the switch 212. When the switch 212 is turned on, a DC current may be applied to the electrostatic electrode 211. An electrostatic force is applied between the electrostatic electrode 211 and the substrate "W" by the current applied to the electrostatic electrode 211. The substrate "W" may be suctioned and supported by the support plate 210 by the electrostatic force.

The heating member 230 (an example of a second component) may be provided inside the support plate 210. The heating member 230 may be a heater. The heating member 230 may be electrically connected to a heater power supply, for example, a heating power supply 233 (an example of a second power supply) via a heating power line 234. The heating power supply 233 may be an alternating current (AC) power supply or the DC power supply. The heating member 230 may receive power from the heating power supply 233 to adjust the temperature of the substrate "W" supported by the support unit 200 to a predetermined temperature. One or more heating members 230 may be provided in a region of the support plate 210.

The heating power line 234 may include a first heating power line 234*a* and a second heating power line 234*b*, wherein the first heating power line 234*a* may be provided at a front end of the coupling blocking structure 700, which will be described below, and the second heating power line 234*b* may be provided at a rear end of the coupling blocking structure 700, which will be described below.

The electrode plate 220 (an example of a first component) is provided below the support plate 210. An upper surface of the electrode plate 220 is in contact with a lower surface of the support plate 210. The electrode plate 220 is provided in a disk shape. The electrode plate 220 is made of a conductive material. As an example, the electrode plate 220 may be made of an aluminum material. An upper central region of the electrode plate 220 has an area corresponding to a bottom surface of the support plate 210.

An upper flow path 221 is provided inside the electrode plate 220. The upper flow path 221 mainly cools the support plate 210. A cooling fluid is supplied to the upper flow path 221. As an example, the cooling fluid may be provided as cooling water or cooling gas.

The electrode plate 220 may be provided as a metal plate. The electrode plate 220 may be electrically connected to a high-frequency power supply, for example, a radio frequency (RF) power supply 227 (an example of a first power supply) via an RF power line 226. The RF power supply 227 may be provided as a high bias power RF power supply. The RF power supply 227 may generate an electric field or an RF electromagnetic field in the treatment space of the chamber 100. The electrode plate 220 may receive high-frequency power from the RF power supply 227.

The plate 250 is provided below the electrode plate 220. The plate 250 may be provided in a circular plate shape. The plate 250 may be provided to have an area corresponding to the electrode plate 220. The plate 250 may be provided as an insulating plate. As an example, the plate 250 may be provided as a dielectric material.

The lower plate 240 is provided below the electrode plate 220. The lower plate 240 is provided below the lower board 260. The lower plate 240 is provided in a ring shape.

The lower board 260 is located below the plate 250. The lower board 260 may be provided as an aluminum material. The lower board 260 is provided in a circular shape when viewed from the top. A lift pin module (not illustrated) or the like that moves the transferred substrate "W" from an external transfer member to the support plate 210 may be located in an internal space of the lower board 260.

The ring member 270 is disposed in an edge region of the support unit 200. The ring member 270 has a ring shape. The ring member 270 is provided to surround an upper part of the support plate 210. The ring member 270 may be provided above the insulator 214 disposed in the edge region of the support plate 210. The ring member 270 may be provided as a focusing ring. The ring member 270 includes an inner part 272 and an outer part 271. The inner part 272 is located inside the ring member 270. The inner part 272 is provided to be lower than the outer part 271. An upper surface of the inner part 272 is provided to have the same height as that of the upper surface of the support plate 210. The inner part 272 supports the edge region of the substrate "W" supported by the support plate 210. The outer part 271 is located outside the inner part 272. The outer part 271 is provided to be higher than the height of an upper surface of the substrate "W". The outer part 271 is provided to surround an outer periphery of the substrate "W".

The shower head unit 300 is located above the support unit 200 inside the chamber 100. The shower head unit 300 is located to face the support unit 200.

The shower head unit 300 includes a shower head 310, a gas spraying plate 320, a cover plate 330, an upper plate 340, an insulating ring 350, and a driving member 360.

The shower head 310 is located to be spaced apart from an upper surface of the chamber 100 by a predetermined distance downward. The shower head 310 is located above the support unit 200. A predetermined space is formed between the shower head 310 and the upper surface of the chamber 100. The shower head 310 may be provided in a plate shape having a constant thickness. The bottom surface of the shower head 310 may be anodized to prevent the occurrence of arcing by plasma. A cross section of the shower head 310 may be provided to have the same shape and the same cross-sectional area as those of the support unit 200. The shower head 310 includes a plurality of spraying holes 311. The spraying holes 311 vertically penetrate an upper surface and a lower surface of the shower head 310.

The shower head 310 may be made of a material that generates a compound by reacting with plasma generated from gas supplied by the gas supply unit 400. As an example, the shower head 310 may be made of a material that generates a compound by reacting with ions, having the highest electronegativity, among ions contained in the plasma. For example, the shower head 310 may be made of a material including silicon. Further, the compound generated by the reaction between the shower head 310 and the plasma may be silicon tetrafluoride.

The shower head 310 may be electrically connected to an upper power supply 370. The upper power supply 370 may be provided as a high-frequency power supply. Unlike this, the shower head 310 may be electrically grounded.

The gas spraying plate 320 is located on the upper surface of the shower head 310. The gas spraying plate 320 is located to be spaced apart from the upper surface of the chamber 100 by a predetermined distance. The gas spraying plate 320 may be provided in a plate shape having a constant thickness. A heater 323 is provided at an edge region of the gas spraying plate 320. The heater 323 heats the gas spraying plate 320.

The gas spraying plate 320 is provided with a diffusion region 322 and a spraying hole 321. The diffusion region 322 uniformly spreads gas supplied from the upper side to the spraying hole 321. The diffusion region 322 is connected to the spraying hole 321 on a lower side thereof. Adjacent diffusion regions 322 are connected to each other. The spraying hole 321 is connected to the diffusion region 322 and vertically penetrates a lower surface of the diffusion region 322.

The spraying hole 321 is located to face the spraying hole 311 of the shower head 310. The gas spraying plate 320 may include a metal material.

The cover plate 330 is located above the gas spraying plate 320. The cover plate 330 may be provided in a plate shape having a constant thickness. The cover plate 330 is provided with a diffusion region 332 and a spraying hole 331. The diffusion region 332 uniformly spreads the gas supplied from the upper side to the spraying hole 331. The diffusion region 332 is connected to the spraying hole 331 on a lower side thereof. Adjacent diffusion regions 332 are connected to each other. The spraying hole 331 is connected to the diffusion region 332 and vertically penetrates a lower surface of the diffusion region 322.

The upper plate 340 is located above the cover plate 330. The upper plate 340 may be provided in a plate shape having a constant thickness. The upper plate 340 may be provided to have the same size as that of cover plate 330. The upper plate 340 has a supply hole 341 formed at a central part thereof. The supply hole 341 is a hole through which the gas passes. The gas having passed through the supply hole 341 is supplied to the diffusion region 332 of the cover plate 330. A cooling flow path 343 is formed inside the upper plate 340. A cooling fluid may be supplied to the cooling flow path 343. As an example, the cooling fluid may be provided as cooling water.

Further, the shower head 310, the gas spraying plate 320, the cover plate 330, and the upper plate 340 may be supported by a rod. For example, the shower head 310, the gas spraying plate 320, the cover plate 330, and the upper plate 340 may be coupled to each other and may be supported by a rod fixed to an upper surface of the upper plate 340. Further, the rod may be coupled to an inside of the chamber 100.

The insulating ring 350 is disposed to surround peripheries of the shower head 310, the gas spraying plate 320, the cover plate 330, and the upper plate 340. The insulating ring 350 may be provided in a circular ring shape. The insulating ring 350 may be formed of a non-metal material. The insulating ring 350 is located to overlap the ring member 270 when viewed from the top. When viewed from the top, a surface, on which the insulating ring 350 and the shower head 310 are in contact with each other, is located to overlap an upper region of the ring member 270.

Figure 5:
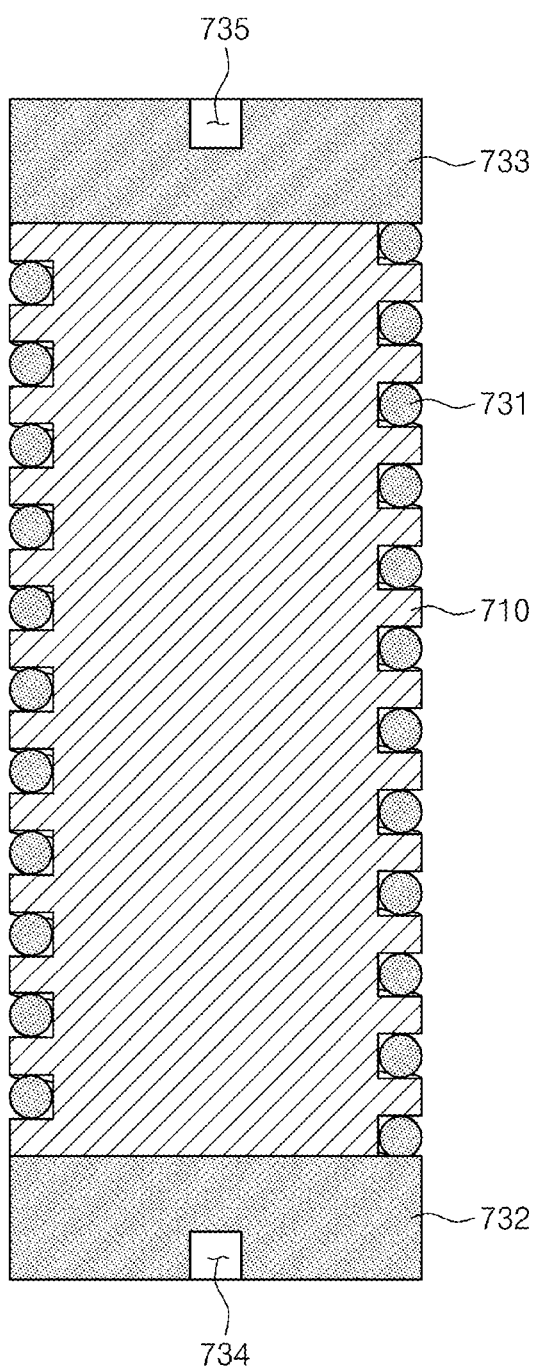
FIG. 5 is a view illustrating a cross section of a first conductive part, a second conductive part, and a conductive line of FIG. 4.

The driving member 360 may adjust a relative height between the insulating ring 350 and the shower head 310. The driving member 360 may adjust a relative height between the insulating ring 350 and the shower head 310 to adjust the density of plasma at an edge region of the substrate "W". The driving member 360 may be connected to the insulating ring 350. As illustrated in FIG. 5, the driving member 360 may vertically elevate the insulating ring 350. When the driving member 360 elevates the insulating ring 350, a lateral area of the shower head 310 exposed to the treatment space may increase. Further, when the driving member 360 lowers the insulating ring 350, the lateral area of the shower head 310 exposed to the treatment space may decrease.

The driving member 360 may be made of various materials capable of elevating the insulating ring 350. For example, the driving member 360 may elevate the insulating ring 350 using a hydraulic cylinder and a pneumatic cylinder. Further, the driving member 360 may elevate the insulating ring 350 using a motor.

The gas supply unit 400 supplies the gas into the chamber 100. The gas supplied by the gas supply unit 400 may be excited into a plasma state by a plasma source. Further, the gas supplied by the gas supply unit 400 may be a gas containing fluorine. For example, the gas supplied by the gas supply unit 400 may be carbon tetrafluoride ($CF_4$).

The gas supply unit 400 includes a gas supply nozzle 410, a gas supply line 420, and a gas storage part 430. The gas supply nozzle 410 is installed at a central portion of the upper surface of the chamber 100. A spraying hole is formed in the bottom surface of the gas supply nozzle 410. The spraying hole supplies a process gas into the chamber 100. The gas supply line 420 connects the gas supply nozzle 410 and the gas storage part 430. The gas supply line 420 supplies a process gas stored in the gas storage part 430 to the gas supply nozzle 410. A valve 421 is installed in the gas supply line 420. The valve 421 opens or closes the gas supply line 420 and adjusts a flow rate of the process gas supplied through the gas supply line 420.

The plasma source excites the process gas inside the chamber 100 into a plasma state. In the embodiment of the inventive concept, a capacitively coupled plasma (CCP) is used as the plasma source. The CCP may include an upper electrode and a lower electrode inside the chamber 100. The upper electrode and the lower electrode may be vertically arranged inside the chamber 100 to be parallel to each other. The high-frequency power may be applied to one electrode of the two electrodes, and the other electrode of the two electrodes may be grounded. An electromagnetic field may be formed in a space between the two electrodes, and the process gas supplied to the space may be excited into a plasma state. A process of treating the substrate "W" is performed using the plasma. According to one example, the upper electrode may be provided to the shower head unit 300 and the lower electrode may be provided to the electrode plate 220. The high-frequency power may be applied to the lower electrode, and the upper electrode may be grounded. Unlike this, the high-frequency power may be applied to both the upper electrode and the lower electrode. Accordingly, an electromagnetic field is generated between the upper electrode and the lower electrode. The generated electromagnetic field excites the process gas provided inside the chamber 100 into a plasma state.

The liner unit 500 prevents an inner wall of the chamber 100 and the support unit 200 from being damaged during the process. The liner unit 500 prevents impurities generated during the process form being deposited on the inner wall and the support unit 200. The liner unit 500 includes an inner liner 510 and an outer liner 530.

The outer liner 530 is provided on the inner wall of the chamber 100. The outer liner 530 has a space having an open upper surface and an open lower surface. The outer liner 530 may be provided in a cylindrical shape. The outer liner 530 may have a radius corresponding to the inner surface of the chamber 100. The outer liner 530 is provided along the inner surface of the chamber 100.

The outer liner 530 may be made of an aluminum material. The outer liner 530 protects an inner surface of a body 110. While the process gas is excited, an arc discharge may occur inside the chamber 100. The arc discharge damages the chamber 100. The outer liner 530 protects the inner surface of the body 110 to prevent the inner surface of the body 110 from being damaged due to the arc discharge.

The inner liner 510 is provided to surround the support unit 200. The inner liner 510 is provided in a ring shape. The inner liner 510 is provided to surround all the support plate 210, the electrode plate 220, and the lower plate 240. The inner liner 510 may be made of an aluminum material. The inner liner 510 protects an outer surface of the support unit 200.

The baffle unit 600 is located between the inner wall of the chamber 100 and the support unit 200. A baffle is provided in an annular ring shape. A plurality of through-holes are formed in the baffle. The gas provided inside the chamber 100 is exhausted to the exhaust hole 102 through the through-holes of the baffle. A flow of the gas may be controlled according to the shape of the baffle and the shape of the through-holes.

The coupling blocking structure 700 may block coupling of the high-frequency power applied by the RF power supply 227 to the heating power supply 233. For example, the coupling blocking structure 700 may block an electric field generated by the high-frequency power applied by the RF power supply 227 from flowing into the heating power supply 233 through the heating member 230. The coupling blocking structure 700 may block the high-frequency power applied by the RF power supply 227 from flowing into the heating power supply 233 through the heating member 230. For example, the coupling blocking structure 700, which is an element for generating inductance, may be also referred to as a coupling blocking unit, a coupling blocking member, and a coupling blocking line. The coupling blocking structure 700 may be installed between the heating power supply 233 and the heating member 230. For example, the coupling blocking structure 700 may be installed on the heating power line 234 provided between the heating power supply 233 and the heating member 230. For example, the coupling blocking structure 700 may be installed between the first heating power line 234a and the second heating power line 234b.

Figure 4:
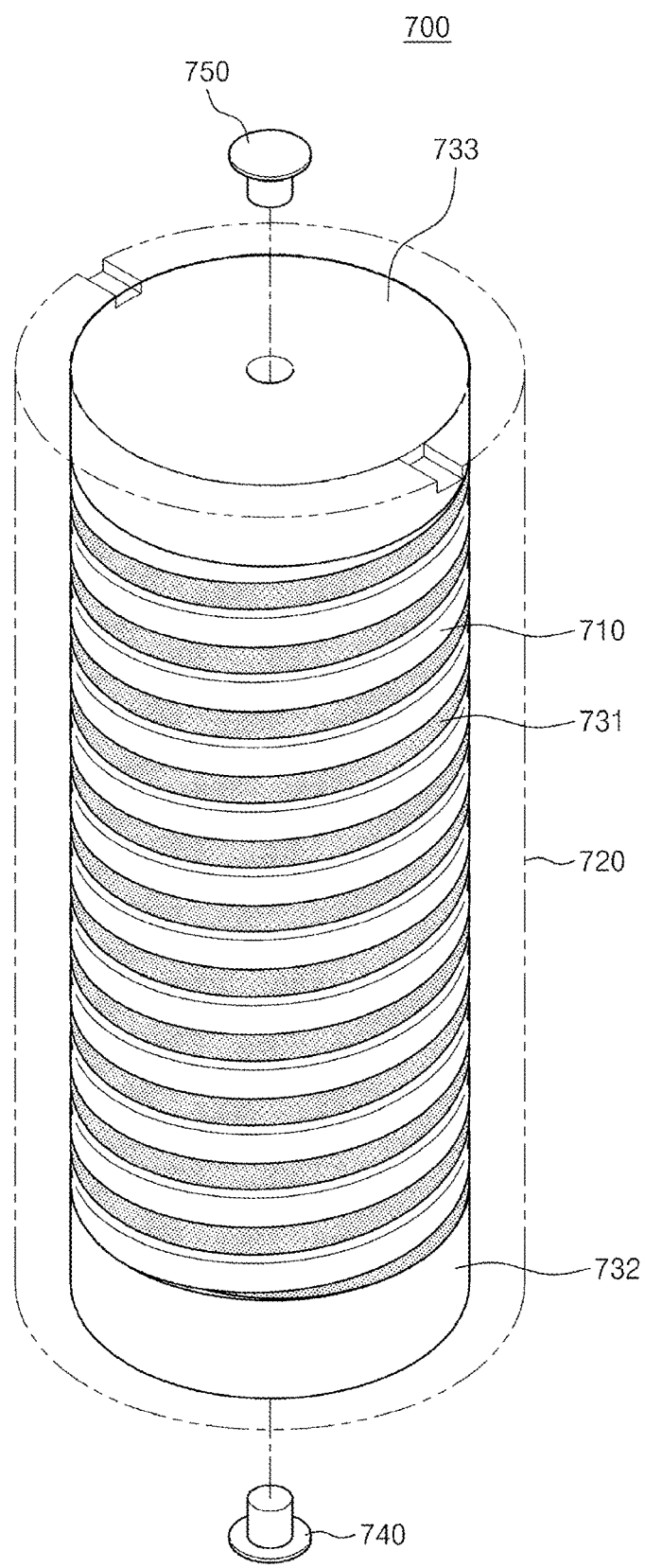
FIG. 4 is a view illustrating a schematic shape of a coupling blocking structure of FIG. 3.

FIG. 4 is a view illustrating a schematic shape of a coupling blocking structure of FIG. 3, and FIG. 5 is a view illustrating a cross section of a first conductive part, a second conductive part, and a conductive line of FIG. 4. Referring to FIGS. 4 and 5, the coupling blocking structure 700 may include a dielectric 710, an insulator 720, a conductive line 731, a first conductive part 732, a second conductive part 733, a first conductive pin 740, and a second conductive pin 750.

The dielectric 710 may have a columnar shape. The dielectric 710 may have a substantially cylindrical shape. A spiral groove formed in a spiral shape from one end to the other end of the dielectric 710 may be formed in the dielectric 710. The conductive line 731 may be provided in the spiral groove formed in the dielectric 710.

The conductive line 731 may be a conductor. The conductive line 731 may be wound around the spiral groove formed in the dielectric 710. Accordingly, the conductive line 731 may have a coil shape as a whole. The conductive line 731 may be made of the same material as those of the first conductive part 732 and the second conductive part 733, which will be described below. Further, the conductive line 731 may be made of the same material as those of the first heating power line 234a and the second heating power line 234b which are described above. Further, the conductive line 731 may be electrically connected to the first conductive part 732 and the second conductive part 733, which will be described below. The electric connection between the conductive line 731 and the first conductive part 732, and the second conductive part 733 means a state in which the conductive line 731, the first conductive part 732, and the second conductive part 733 are separately provided but are in contact with each other as well as a state in which the conductive line 731, the first conductive part 732, and the second conductive part 733 are integrally provided.

The first conductive part 732 and the second conductive part 733 may be conductors. The first conductive part 732 and the second conductive part 733 may be electrically connected to the conductive line 731. For example, the first conductive part 732 may be in contact with one end of the conductive line 731, and the second conductive part 733 may be in contact with the other end of the conductive line 731. The first conductive part 732 and the second conductive part 733 may have a columnar shape of which the vertical lengths are smaller than the vertical length of the dielectric 710. Further, the first conductive part 732 may be provided in contact with one end of the dielectric 710, and the second conductive part 733 may be provided in contact with the other end of the dielectric 710. Further, a first pin groove 734 may be formed in the first conductive part 732, and a second pin groove 735 may be formed in the second conductive part 733. The first conductive pin 740 may be inserted into the first pin groove 734. Further, the second conductive pin 750 may be inserted into the second pin groove 735. The first conductive pin 740 and the second conductive pin 750 may be conductors and may be made of the same material as those of the conductive line 731, the first conductive part 732, and the second conductive part 733. Further, the first conductive pin 740 and the second conductive pin 750 may be made of the same material as those of the first heating power line 234a and the second heating power line 234b, which have been described above.

The insulator 720 may be provided to surround the dielectric 710, the conductive line 731, the first conductive part 732, and the second conductive part 733. The insulator 720 may surround the dielectric 710, the conductive line 731, the first conductive part 732, and the second conductive part 733 so that a surface of the first conductive part 732, in which the first pin groove 734 is formed, is exposed. Further, the insulator 720 may surround the dielectric 710, the conductive line 731, the first conductive part 732, and the second conductive part 733 so that a surface of the second conductive part 733, in which the second pin groove 735 is formed, is exposed.

Figure 6:
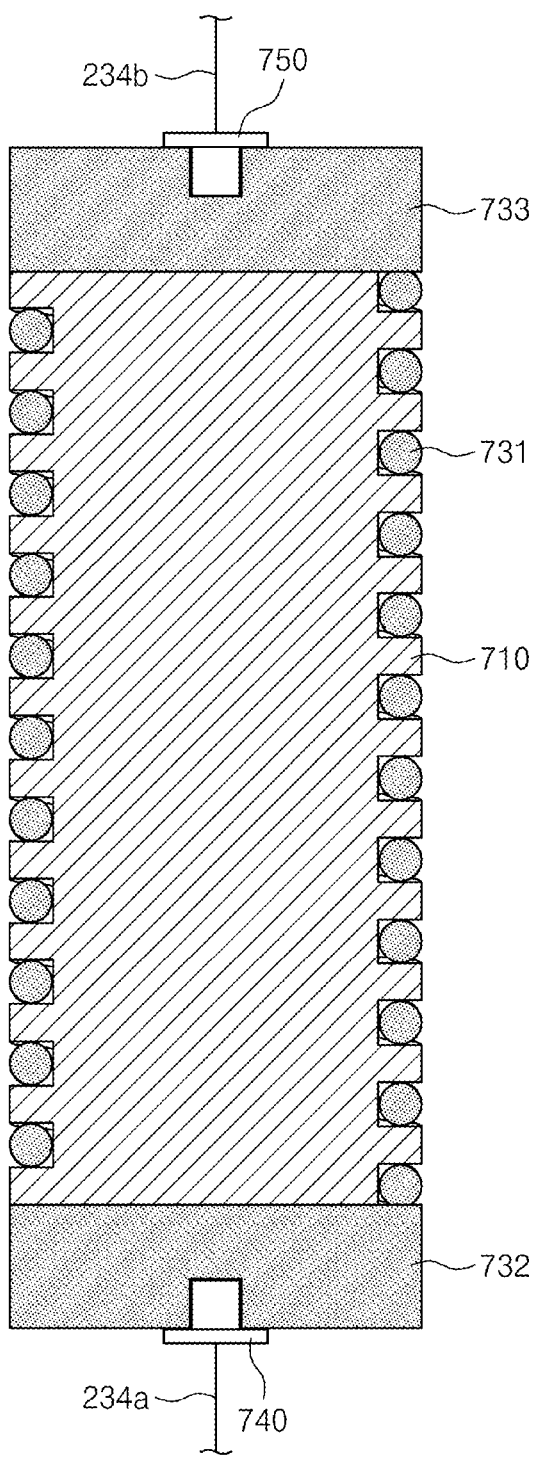
FIG. 6 is a view illustrating a state in which a heating power line is connected to the coupling blocking structure of FIG. 4.

FIG. 6 is a view illustrating a state in which a heating power line is connected to the coupling blocking structure of FIG. 4. Referring to FIG. 6, the first heating power line 234a may be electrically connected to the first conductive pin 740. The first conductive pin 740 may be electrically connected to the first conductive part 732. The first conductive part 732 may be electrically connected to the conductive line 731. The conductive line 731 may be electrically connected to the second conductive part 733. The second conductive part 733 may be electrically connected to the second conductive pin 750. The second conductive pin 750 may be electrically connected to the second heating power line 234b.

As described above, the conductive line 731 may have a substantially coil shape. Further, the conductive line 731 may be a conductor. That is, the conductive line 731 may have a frequency characteristic similar to that of an inductor that is an element or structure that generates inductance. Accordingly, the conductive line 731 may have a frequency characteristic that suppresses passage of a high-frequency signal. Further, as described above, the heating power supply 233 may transmit, to the heating member 230, the AC power or DC power having a frequency that is relatively smaller than that of the RF power supply 227. Accordingly, the AC power or the DC power generated by the heating power supply 233 may be appropriately transmitted to the heating member 230. In contrast, the RF power supply 227 may generate high-frequency power. Accordingly, even when the RF power such as RF electromagnetic fields or strong electric fields generated in the treatment space inside the chamber 100 flows to the heating power line 234 through the heating member 230, such high-frequency RF power may be blocked from flowing into the heating power supply 233 by a frequency characteristic of the conductive line 731 that suppresses the passage of the high-frequency signal.

Figure 7:
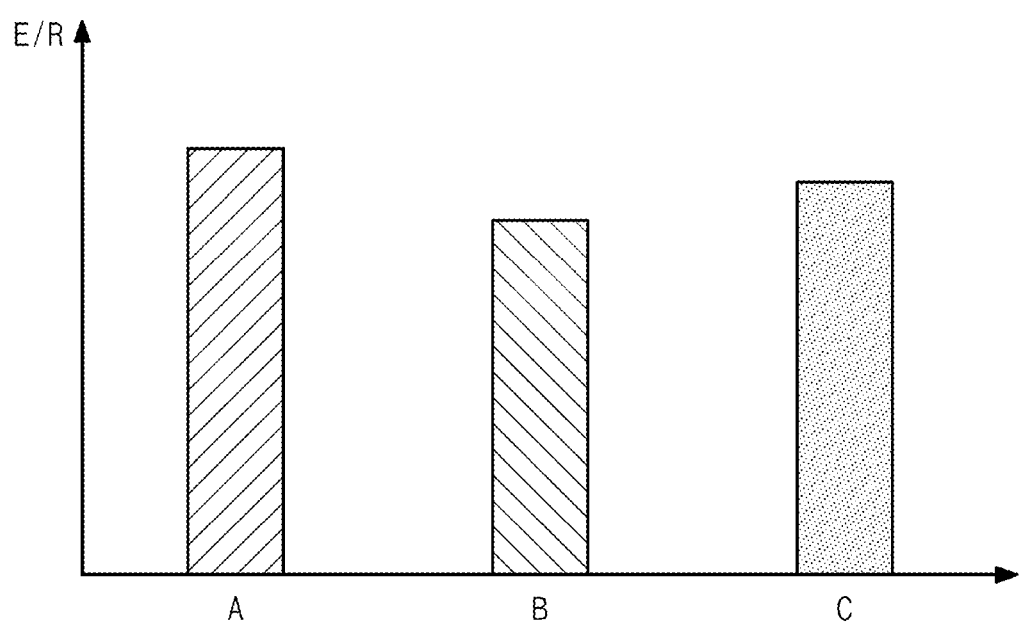
FIG. 7 is a graph depicting comparison between substrate treating rates when the heating power line is not connected to a heating member, when the heating power line is connected to the heating member and the coupling blocking structure is not installed, and when the heating power line is connected to the heating member and the coupling blocking structure is installed, according to one embodiment of the inventive concept.

This may also be identified through experimental data. For example, FIG. 7 is a graph depicting comparison between substrate treating rates when the heating power line is not connected to a heating member, when the heating power line is connected to the heating member and the coupling blocking structure is not installed, and when the heating power line is connected to the heating member and the coupling blocking structure is installed, according to one embodiment of the inventive concept. In FIG. 7, "A" denotes a rate (for example, an etching rate) of treating the substrate "W" when the heating power line 234 is removed from the heating member 230, "B" denotes a rate of treating the substrate "W" when the heating power line 234 is connected to the heating member 230 and the coupling blocking structure 700 is not installed on the heating power line 234, and "C" denotes a rate of treating the substrate "W" when the heating power line 234 is connected to the heating member 230 and the coupling blocking structure 700 is installed on the heating power line 234.

Since the etching rate of "A" is the highest, when the etching rate of "A" is set as 100%, the etching rate of "B" is 83% compared to that of "A", and the etching rate of "C" is 92% compared to that of "A". Since the case of "A" corresponds to a case in which the heating member 230 cannot generate heat, the substrate "W" cannot be properly adjusted to a predetermined temperature. Thus, in practice, valid comparison targets would be "B" and "C". Further, when "B" and "C" are compared with each other, it may be seen that the treatment rate for the substrate "W" is higher when the coupling blocking structure 700 is installed.

That is, according to one embodiment of the inventive concept, the coupling blocking structure 700 blocks the RF power of the RF power supply 227 from flowing into the heating power supply 233 and suppresses loss of the RP power of the RF power supply 227. Thus, the treatment efficiency for the substrate "W" may further increase, and a failure or malfunction of the heating power supply 233 may be also prevented effectively. Further, in general, the coupling blocking structure 700 according to the inventive concept merely has a structure in which the conductive line 731 has a coil shape and the insulator 720 surrounds the conductive line 731, and thus does not have a large volume. Thus, it is very easy to arrange the coupling blocking structure 700 in a narrow space in the chamber 100.

Further, a plurality of coupling blocking structures 700 having different input impedances are provided, a selected coupling blocking structure 700 among these coupling blocking structures 700 is installed in the substrate treating apparatus 1000, and thus a selective RF blocking characteristic may be adjusted.

Figure 8:
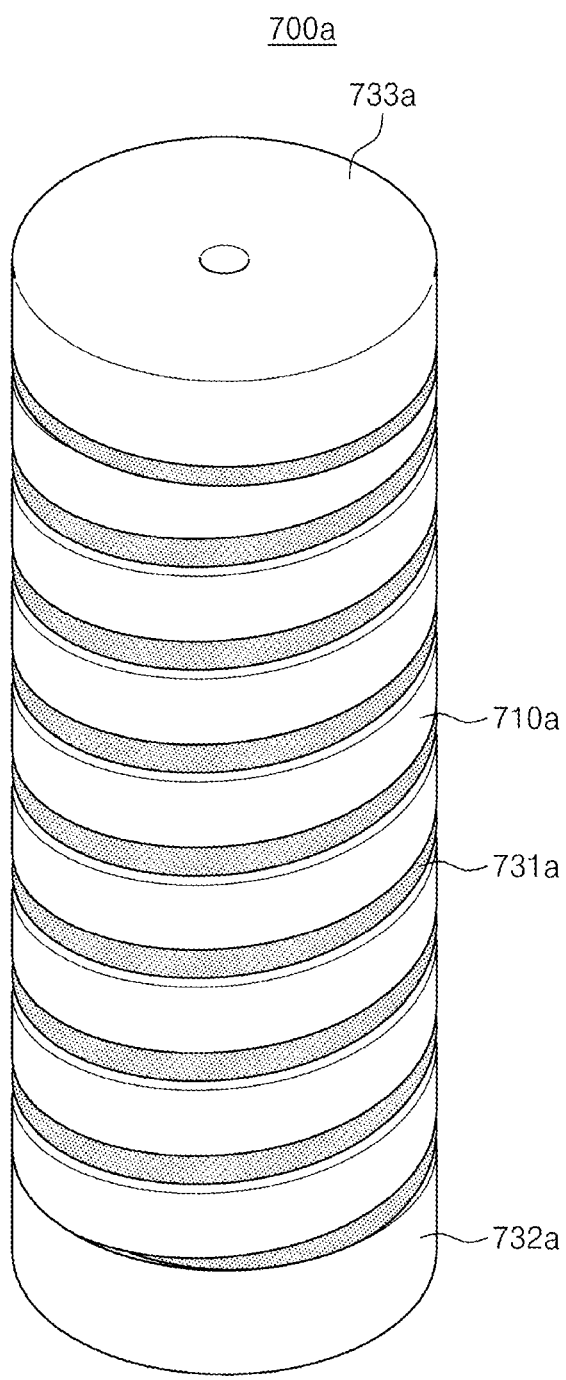
FIGS. 8 to 10 are views illustrating a coupling blocking structure according to another embodiment of the inventive concept.

For example, a first coupling blocking structure 700a illustrated in FIG. 8 may have substantially the identical or similar structure to the above-described coupling blocking structure 700. For example, the first coupling blocking structure 700a may have a first dielectric 710a, a first conductive line 731a, a $(1-1)^{th}$ conductive part 732a, and a $(1-2)^{th}$ conductive part 733a. The first conductive line 731a may be wound around the first dielectric 710a "n" times.

Figure 9:
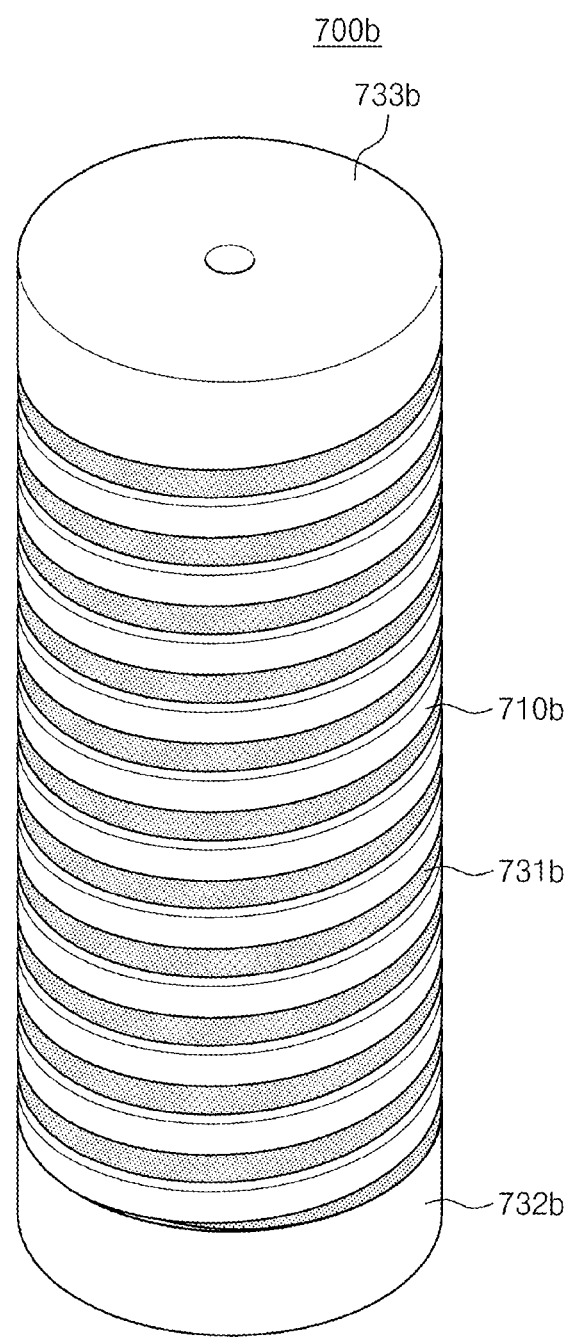

A second coupling blocking structure 700b illustrated in FIG. 9 may have substantially the identical or similar structure to the above-described coupling blocking structure 700. For example, the second coupling blocking structure 700b may have a second dielectric 710b, a second conductive line 731b, a $(2-1)^{th}$ conductive part 732b, and a $(2-2)^{th}$ conductive part 733b. The number of times the second conductive line 731b is wound around the second dielectric 710b may be greater than the number of times the first conductive line 731a is wound around the first dielectric 710a.

Figure 10:
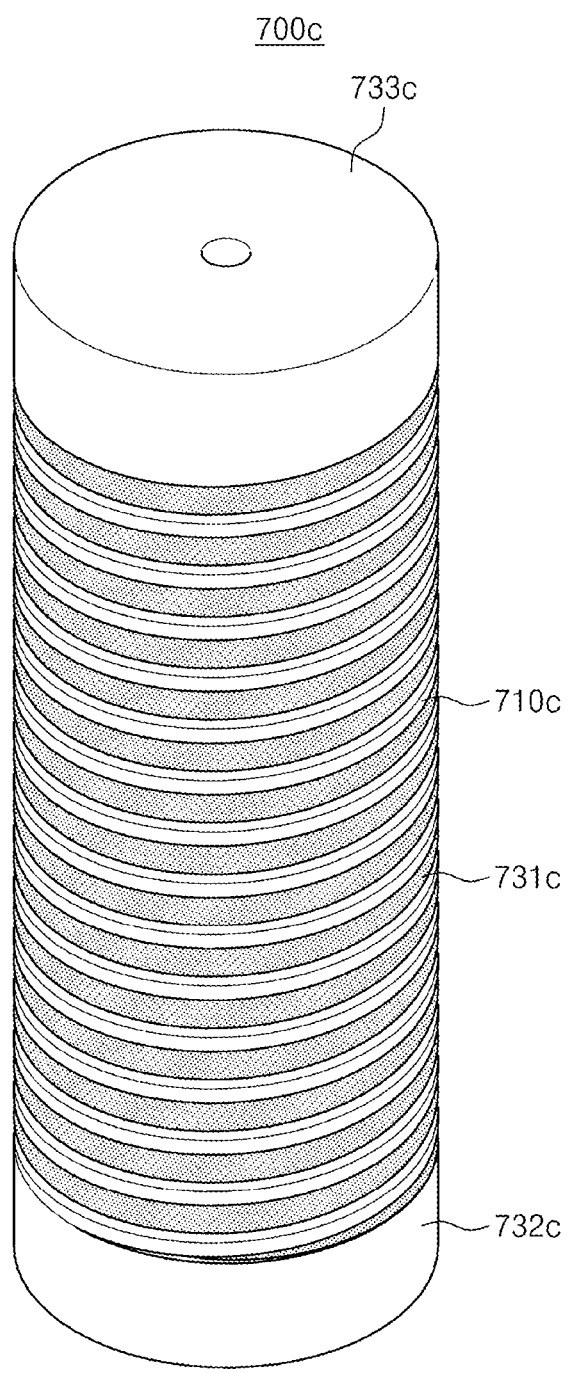

A third coupling blocking structure 700c illustrated in FIG. 10 may have substantially the identical or similar structure to the above-described coupling blocking structure 700. For example, the third coupling blocking structure 700c may have a third dielectric 710c, a third conductive line 731c, a $(3-1)^{th}$ conductive part 732c, and a $(3-3)^{th}$ conductive part 733c. The number of times the third conductive line 731c is wound around the third dielectric 710c may be greater than the number of times the second conductive line 731b is wound around the second dielectric 710b.

Figure 11:
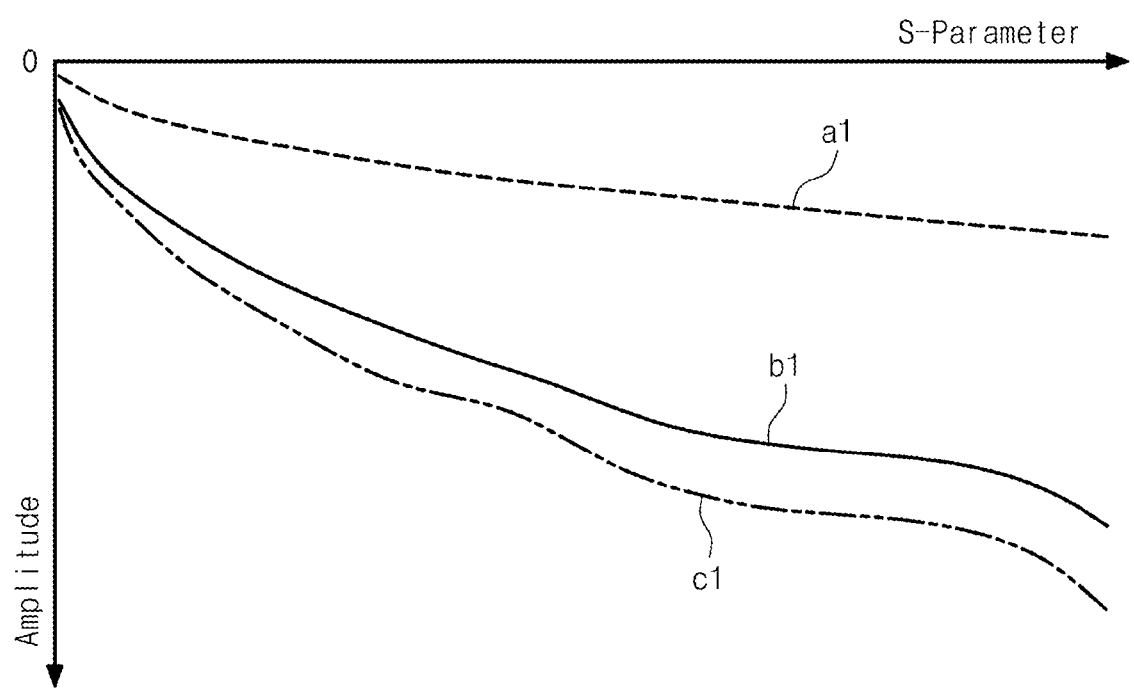
FIG. 11 is a view illustrating blocking characteristics of high-frequency power when the coupling blocking structures according to another embodiment of the inventive concept are installed in the substrate treating apparatus.

In this case, when the number of times the conductive lines 731, 731aa, 731b, and 731c are wound around the dielectrics 710, 710a, 710b, and 710c is changed, the conductive lines 731, 731a, 731b, and 731c have different input impedances. Accordingly, as illustrated in FIG. 11, the coupling blocking structures 700, 700a, 700b, and 700c have different RF blocking characteristics, a1 denotes an RF blocking characteristic of the first coupling blocking structure 700a, b1 denotes an RF blocking characteristic of the second coupling blocking structure 700b, and c1 denotes an RF blocking characteristic of the third coupling blocking structure 700c. That is, the user may adjust a selective RF blocking characteristic by replaceably installing a selected coupling blocking structure 700, 700a, 700b, and 700c from among the coupling blocking structure 700, 700a, 700b, and 700c having different RF blocking characteristics in the substrate treating apparatus 1000. Since pin grooves having the same size and the same shape are formed in the coupling blocking structures 700, 700a, 700b, and 700c, the coupling blocking structures 700, 700a, 700b, and 700c may be replaced more easily.

It has been described in the above-described example that the RF blocking characteristics is selectively adjusted by replacing and installing the coupling blocking structures 700, 700a, 700b, and 700c having different numbers of times the conductive lines 731, 731a, 731b, and 731c are wound therearound, but the inventive concept is not limited thereto. For example, the RF blocking characteristics may be selectively adjusted by replacing and installing the coupling blocking structures 700, 700a, 700b, and 700c having the same number of times the conductive lines 731, 731a, 731b, and 731c are wound therearound but having different diameters of the conductive lines 731, 731a, 731b, and 731c when viewed from a cross section. For example, the first conductive line 731a of the first coupling blocking structure 700a may have a first thickness, and the second conductive line 731b of the second coupling blocking structure 700b may have a second thickness that is different from the first thickness. The user may selectively adjust the RF blocking characteristics by installing, on the heating power line 234, one coupling blocking structure selected from the first coupling blocking structure 700a and the second coupling blocking structure 700b.

It has been described in the above-described example that the RF blocking characteristics is selectively adjusted by replacing and installing the coupling blocking structures 700, 700a, 700b, and 700c having different numbers of times the conductive lines 731, 731a, 731b, and 731c are wound therearound, but the inventive concept is not limited thereto. For example, the RF blocking characteristics may be selectively adjusted by replacing and installing the coupling blocking structures 700, 700a, 700b, and 700c having the same number of times the conductive lines 731, 731a, 731b, and 731c are wound therearound but having different turns gaps of the conductive lines 731, 731a, 731b, and 731c.

It has been described in the above-described example that the substrate treating apparatus 1000 is a CCP type plasma treating apparatus, but the inventive concept is not limited thereto. For example, the above-described coupling blocking structure 700 may be equally/similarly applied even to an inductively coupled plasma (ICP) type plasma treating apparatus. For example, the RF power supply 227 may be connected to an antenna that generates the RF electromagnetic fields or strong electric fields.

It has been described in the above-described example that the coupling blocking structure 700 is installed on the heating power line 234, but the inventive concept is not limited thereto. For example, the coupling blocking structure 700 may be installed on a line provided between a power supply that generates power having a lower frequency than that of the RF power supply 227 and a component that is connected to the power supply and is disposed in the treatment space of the chamber 100.

In the above-described example, the apparatus for performing an etching process on the substrate has been described. However, unlike this, the inventive concept may be applied to apparatuses performing various processes using plasma and having a shower head facing a substrate. For example, the above-described shower head unit, the substrate treating apparatus including the same, and a substrate treating method may be applied to an apparatus performing a deposition process or an ashing process using plasma.

According to an embodiment of the inventive concept, a substrate may be efficiently treated.

Further, according to an embodiment of the inventive concept, an etching rate for a substrate may be further increased.

Further, according to an embodiment of the inventive concept, coupling of high-frequency power applied by an RF power supply to a heater power supply may be blocked.

Further, according to an embodiment of the inventive concept, the coupling of the high-frequency power applied by the RF power supply to the heater power supply may be blocked, and the coupling blocking structure may be easily installed and/or replaced.

The effects of the inventive concept are not limited to the above-mentioned effects, and the unmentioned effects can be clearly understood by those skilled in the art to which the inventive concept pertains from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
a chamber having a treatment space;
a first power supply being a high-frequency power supply and configured to apply power to a first component provided in the treatment space;
a second power supply being an alternating current (AC) power supply or a direct current (DC) power supply and configured to apply power to a second component provided in the treatment space; and
a coupling blocking structure installed on a power line connected to the second power supply and the second component and configured to block coupling of high-frequency power generated by the first power supply to the second power supply,
wherein the coupling blocking structure is electrically connected to the power line,
wherein the coupling blocking structure includes:
a conductive line having a coil shape;
a dielectric around which the conductive line is wound; and
a conductive part electrically connected to one end of the conductive line and one end of the power line,
wherein a spiral groove, in which the conductive line is provided, extends in the dielectric, and
wherein the spiral groove extends from a bottom surface of conductive part, such that, in the spiral groove, the conductive line is disposed on the bottom surface of conductive part and on an upper surface of the dielectric.

2. The substrate treating apparatus of claim 1, wherein the dielectric has a columnar shape around which the conductive line is wound.

3. The substrate treating apparatus of claim 1, wherein a pin groove, into which a conductive pin connected to the one end of the power line is inserted, is formed in the conductive part.

4. The substrate treating apparatus of claim 1, wherein the coupling blocking structure further includes:
an insulator configured to surround the conductive part, the dielectric, and the conductive line.

5. The substrate treating apparatus of claim 1, wherein the second component is a heater configured to heat the treatment space or a substrate treated in the treatment space.

6. The substrate treating apparatus of claim 5, wherein the first component is an electrode plate configured to generate plasma in the treatment space.

7. A substrate treating apparatus comprising:
a chamber having a treatment space;
a first power supply configured to generate a radio frequency (RF) electromagnetic field;
a second power supply configured to transmit power to a heater provided in the treatment space; and
a coupling blocking structure installed on a power line provided between the second power supply and the heater,
wherein the coupling blocking structure is electrically connected to the power,
wherein the coupling blocking structure includes:
a conductive line having a coil shape;
a dielectric around which the conductive line is wound; and
a conductive part electrically connected to one end of the conductive line and one end of the power line,
wherein a spiral groove in which the conductive line is provided extends in the dielectric, and
wherein the spiral groove extends from a bottom surface of conductive part, such that, in the spiral groove, the conductive line is disposed on the bottom surface of conductive part and on an upper surface of the dielectric.

8. The substrate treating apparatus of claim 7, wherein the dielectric has a columnar shape around which the conductive line is wound.

9. The substrate treating apparatus of claim 7, wherein the power line includes:
a first power line provided at a front end of the coupling blocking structure; and
a second power line provided at a rear end of the coupling blocking structure, and
wherein the coupling blocking structure further includes:
another conductive part electrically connected to another end of the conductive line and one end of the second power line.

10. The substrate treating apparatus of claim 9, wherein a pin groove, into which a conductive pin connected to the power line is inserted, is formed in at least one of the conductive part and the another conductive part.

11. The substrate treating apparatus of claim 9, wherein at least one of the conductive part and the another conductive part has a columnar shape.

12. The substrate treating apparatus of claim 7, wherein the coupling blocking structure further includes:
an insulator configured to surround the conductive part, the dielectric, and the conductive line.

13. The substrate treating apparatus of claim 7, wherein the first power supply is an RF power supply configured to apply power to an antenna or an electrode plate, and wherein the second power supply is an AC power supply or a DC power supply configured to transmit power to the heater.

14. A substrate treating apparatus comprising:
a chamber having a treatment space;
a support unit configured to support a substrate in the treatment space;
an RF power supply configured to generate an electric field in the treatment space;
a heating power supply configured to transmit power to a heater provided in the support unit; and
a coupling blocking structure installed on a power line provided between the heating power supply and the heater,
wherein the coupling blocking structure includes:
   a conductive line electrically connected to the power line and having a coil shape;
   a dielectric having a columnar shape around which the conductive line is wound and having a spiral groove in which the conductive line is provide; and
   a conductive part electrically connected to one end of the conductive line and one end of the power line, and
wherein a spiral groove, in which the conductive line is provided, extends in the dielectric, and
wherein the spiral groove extends from a bottom surface of conductive part, such that, in the spiral groove, the conductive line is disposed on the bottom surface of conductive part and on an upper surface of the dielectric.

15. The substrate treating apparatus of claim 14, wherein the coupling blocking structure further includes:
   an insulator configured to surround the conductive part, the dielectric, and the conductive line.

16. The substrate treating apparatus of claim 14, wherein the coupling blocking structure is provided as one of a first coupling blocking structure in which the conductive line is wound around the dielectric "n" times, and a second coupling blocking structure in which a number of times the conductive line is wound around the dielectric is different from that of the first coupling blocking structure, and is installed on the power line.

17. The substrate treating apparatus of claim 14, wherein the coupling blocking structure is provided as one of a first coupling blocking structure in which the conductive line has a first thickness and a second coupling blocking structure in which the conductive line has a second thickness that is different from the first thickness, and is installed on the power line.

* * * * *